United States Patent
Yasuda et al.

(10) Patent No.: US 9,884,979 B2
(45) Date of Patent: Feb. 6, 2018

(54) TEMPORARY ADHESION METHOD AND METHOD FOR PRODUCING THIN WAFER

(71) Applicant: SHIN-ETSU CHEMICAL CO., LTD., Tokyo (JP)

(72) Inventors: Hiroyuki Yasuda, Tomioka (JP); Michihiro Sugo, Takasaki (JP); Masahito Tanabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/271,056

(22) Filed: Sep. 20, 2016

(65) Prior Publication Data
US 2017/0101555 A1 Apr. 13, 2017

(30) Foreign Application Priority Data
Oct. 8, 2015 (JP) .................................. 2015-200566

(51) Int. Cl.
*C09J 7/02* (2006.01)
*C09J 125/06* (2006.01)
(Continued)

(52) U.S. Cl.
CPC ............... *C09J 7/0242* (2013.01); *C09J 5/06* (2013.01); *C09J 7/0275* (2013.01); *C09J 125/06* (2013.01);
(Continued)

(58) Field of Classification Search
None
See application file for complete search history.

(56) References Cited

U.S. PATENT DOCUMENTS

| 7,541,264 B2 | 6/2009 | Gardner et al. |
| 2005/0233547 A1 | 10/2005 | Noda et al. |
| (Continued) | | |

FOREIGN PATENT DOCUMENTS

| JP | 2004-064040 A | 2/2004 |
| JP | 2006-328104 A | 12/2006 |
| JP | 2010-043211 A | 2/2010 |

OTHER PUBLICATIONS

Feb. 28, 2017 Extended Search Report issued in European Patent Application No. 16002077.2.

*Primary Examiner* — Jiong-Ping Lu
(74) *Attorney, Agent, or Firm* — Oliff PLC

(57) ABSTRACT

The present invention is a temporary adhesion method for temporarily bonding a support and a wafer via a temporary adhesive material, including attaching the wafer to the support via the temporary adhesive material including a complex temporary adhesive material layer that consists of a thermoplastic resin layer (A) exhibiting a storage modulus E' of 1 to 500 MPa and a tensile rupture strength of 5 to 50 MPa at 25° C. and a thermosetting polymer layer (B) exhibiting a storage modulus E' of 1 to 1000 MPa and a tensile rupture strength of 1 to 50 MPa at 25° C. after curing, wherein the attaching is performed by forming the layer (A) on the front surface of the wafer from a liquid composition (A'), forming the layer (B) on the support by laminating a film resin (B'), and then heating the wafer and the support under reduced pressure, or forming the layer (A) on the front surface of the wafer from the liquid composition (A'), forming the layer (B) on the layer (A) by laminating the film resin (B'), and then heating the wafer and the support under reduced pressure, and heat curing the layer (B). This temporary adhesion method facilitates temporary adhesion and separation and can increase productivity of thin wafers.

18 Claims, 1 Drawing Sheet

(51) Int. Cl.
    *C09J 183/04*     (2006.01)
    *C09J 163/00*     (2006.01)
    *C09J 5/06*     (2006.01)
    *H01L 21/683*     (2006.01)
    *H01L 21/304*     (2006.01)
    *H01L 21/02*     (2006.01)
    *H01L 21/768*     (2006.01)

(52) U.S. Cl.
    CPC ........... *C09J 163/00* (2013.01); *C09J 183/04* (2013.01); *H01L 21/02057* (2013.01); *H01L 21/304* (2013.01); *H01L 21/6835* (2013.01); *H01L 21/6836* (2013.01); *H01L 21/76898* (2013.01); *C09J 2203/326* (2013.01); *C09J 2205/114* (2013.01); *C09J 2205/302* (2013.01); *C09J 2423/041* (2013.01); *H01L 2221/6834* (2013.01); *H01L 2221/68327* (2013.01)

(56) References Cited

U.S. PATENT DOCUMENTS

| | | | |
|---|---|---|---|
| 2010/0040895 A1 | 2/2010 | Hamada et al. | |
| 2013/0029145 A1 | 1/2013 | Kato et al. | |
| 2013/0220687 A1 | 8/2013 | Tagami et al. | |
| 2013/0280886 A1* | 10/2013 | Kato | B32B 7/06 |
| | | | 438/459 |
| 2015/0064385 A1 | 3/2015 | Flaim et al. | |

* cited by examiner

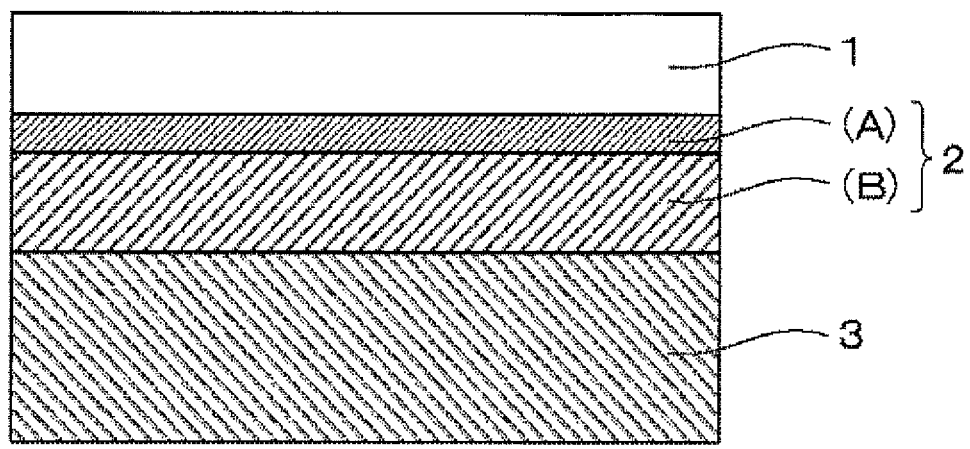

US 9,884,979 B2

TEMPORARY ADHESION METHOD AND METHOD FOR PRODUCING THIN WAFER

TECHNICAL FIELD

The present invention relates to a temporary adhesion method between a wafer and a support and a method for producing a thin wafer.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) to form a multilayer. To realize this technique, steps of grinding a non-circuit-forming surface (also referred to as "back surface") of a substrate on which a semiconductor circuit has been formed to thin the substrate, and then forming an electrode including a TSV on the back surface, are required. In the step of grinding the back surface of a silicon substrate, a protective tape for the back surface is conventionally attached to a back side of the surface to be ground to prevent the wafer from breaking during grinding. However, this tape uses an organic resin film as its supporting base, which has flexibility, but inadequate strength and heat resistance. Thus, this tape is not suited to the steps of forming a TSV and forming a wiring layer on the back surface.

In this context, there has been proposed a system in which a semiconductor substrate is bonded to a support made of silicon, glass or the like, through an adhesive layer to sufficiently withstand the steps of grinding the back surface and forming a TSV and an electrode on the back surface. In this system, the adhesive layer used for bonding the substrate to the support is important. The adhesive layer requires a sufficient durability to bond the substrate and the support without gaps and to withstand subsequent steps, and also requires an ability to easily detach a thin wafer from the support finally. The adhesive layer, which is finally removed, is hence referred to as "temporary adhesive layer" (or temporary adhesive material layer) herein.

With respect to the conventionally known temporary adhesive layer and a method for removing this layer, the following techniques have been proposed: an adhesive material containing a light-absorbing substance is irradiated with high intensity light to decompose the adhesive material layer, whereby the adhesive material layer is removed from the support (Patent Literature 1); a heat fusible hydrocarbon compound is used for the adhesive material, and bonding and removal are carried out in a heat-molten state (Patent Literature 2). The former technique has problems of requiring expensive tools such as laser, and a long treatment time per substrate. The latter technique is simple because of control only by heat, but thermal stability is insufficient at a high temperature exceeding 200° C., and thus the applicable range is limited. Furthermore, these temporary adhesive layers are not adequate to form a film with uniform thickness on a heavily stepped substrate and to provide a complete adhesion to the support.

Moreover, it has been proposed to use a silicone pressure sensitive adhesive for the temporary adhesive material layer (Patent Literature 3). In this technique, a substrate is bonded to a support with an addition-curable silicone pressure sensitive adhesive, and on the removal, the assembly is immersed in a chemical solution capable of dissolving or decomposing the silicone resin to separate the substrate from the support. Thus, this method takes a very long time for separation and is difficultly applied to the actual producing process. Moreover, a method of applying a liquid composition by spin coating and removing a solvent to form a resin layer on the wafer has problems of decrease in yield and increase in cost.

Moreover, it has been proposed to use a silicone adhesive for semiconductor (Patent Literature 4). However, this technique causes cracks when the adhesive is formed into a film on a protective film due to an extremely high elastic modulus after curing, thus failing in lamination process.

CITATION LIST

Patent Literature

PATENT LITERATURE 1: Japanese Unexamined Patent publication (Kokai) No. 2004-64040
PATENT LITERATURE 2: Japanese Unexamined Patent publication (Kokai) No. 2006-328104
PATENT LITERATURE 3: U.S. Pat. No. 7,541,264
PATENT LITERATURE 4: Japanese Unexamined Patent publication (Kokai) No. 2010-043211

SUMMARY OF INVENTION

Technical Problem

The present invention was accomplished in view of the above-described problems. It is an object of the present invention to provide a temporary adhesion method and a method for producing a thin wafer that facilitate temporary adhesion, allow formation of a layer with uniform film thickness on a heavily stepped substrate, are highly compatible with the steps of forming a TSV and forming a wiring on the back surface of the wafer, have excellent resistance to a thermal process for wafer such as chemical vapor deposition (CVD), allow easy separation, and can increase productivity of thin wafers.

Solution to Problem

To achieve this object, the present invention provides a temporary adhesion method for temporarily bonding a support and a wafer having a front surface on which a circuit is formed and a back surface to be processed via a temporary adhesive material for a wafer processing, the method comprising the steps of:

attaching the wafer to the support via the temporary adhesive material for a wafer processing including a two-layered complex temporary adhesive material layer that consists of a first temporary adhesive layer composed of a thermoplastic resin layer (A) exhibiting a storage modulus E' of 1 to 500 MPa and a tensile rupture strength of 5 to 50 MPa at 25° C. and a second temporary adhesive layer composed of a thermosetting polymer layer (B) exhibiting a storage modulus B' of 1 to 1000 MPa and a tensile rupture strength of 1 to 50 MPa at 25° C. after curing, wherein the attaching is performed by forming the thermoplastic resin layer (A) on the front surface of the wafer from a liquid composition (A') containing a thermoplastic resin, forming the thermosetting polymer layer (B) on the support by laminating a film resin (B') that has been formed from a composition containing a thermosetting polymer, and then heating the wafer and the support under reduced pressure, or forming the thermoplastic resin layer (A) on the front surface of the wafer from the liquid composition (A'), forming the thermosetting polymer layer (B) on the resin layer (A) by laminating the film resin (B'), and then heating the wafer and the support under reduced pressure; and adhesively bonding the thermoplastic resin layer (A) and the thermosetting polymer layer (B) by heat curing the thermosetting polymer layer (B).

Such a temporary adhesion method facilitates temporary adhesion between the wafer and the support, allows formation of the layer with uniform film thickness on a heavily stepped substrate, enables high compatibility with the steps of forming a TSV and forming a wiring on the back surface of the wafer and excellent resistance to a thermal process such as CVD, allows easy separation, and can increase productivity of thin wafers.

In the step of attaching, the attaching is preferably performed under heating at 40 to 200° C.

Such a temporary adhesion method enables the wafer to be surely attached to the support via the temporary adhesive material for a wafer processing.

The thermoplastic resin layer (A) is preferably a non-silicone thermoplastic resin layer.

The complex temporary adhesive material layer including a non-silicone thermoplastic resin layer facilitates, after a thin wafer is produced, separating the wafer from the support and cleaning the wafer. Thus, a fragile thin wafer can be more easily handled.

The thermosetting polymer layer (B) is preferably a thermosetting siloxane-modified polymer layer.

The thermosetting siloxane-modified polymer layer is excellent in heat resistance and thus preferable. In addition, a composition containing a thermosetting siloxane-modified polymer can be easily formed into a film resin. Thus, when the thermosetting polymer layer (B) is a thermosetting siloxane-modified polymer layer, yield can be improved.

The thermosetting siloxane-modified polymer layer is preferably a layer of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

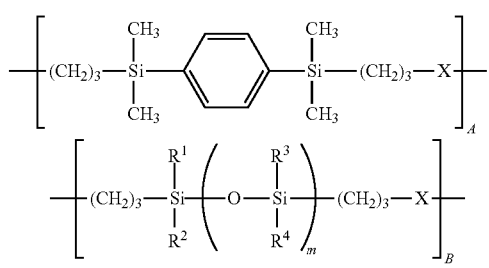

(1)

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and X is a divalent organic group shown by the following general formula (2),

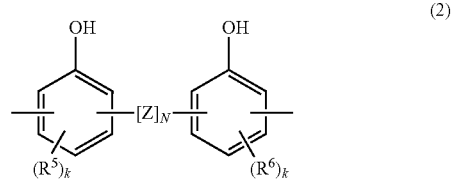

(2)

wherein Z represents a divalent organic group selected from any of

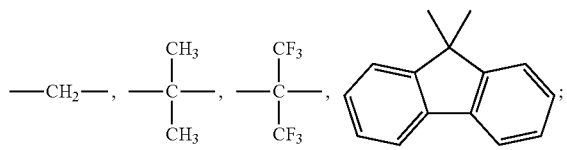

N represents 0 or 1; $R^5$ and $R^6$ each represent an alkyl or alkoxy group having 1 to 4 carbon atoms, and may be the same or different from each other; and "k" represents any of 0, 1, and 2.

Such a thermosetting siloxane-modified polymer layer is more excellent in heat resistance and thus preferable.

The thermosetting siloxane-modified polymer layer is preferably a layer of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

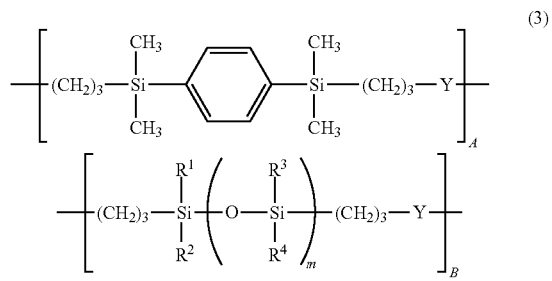

(3)

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and Y is a divalent organic group shown by the following general formula (4),

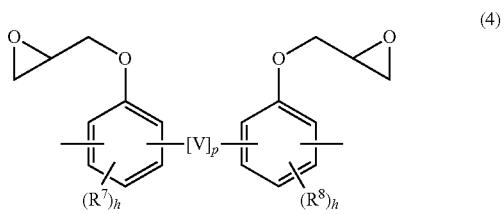

(4)

wherein V represents a divalent organic group selected from any of

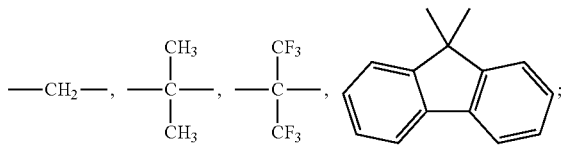

"p" represents 0 or 1; $R^7$ and $R^8$ each represent an alkyl or alkoxy group having 1 to 4 carbon atoms, and may be the same or different from each other; and "h" represents any of 0, 1, and 2.

Such a thermosetting siloxane-modified polymer layer is more excellent in heat resistance and thus preferable.

The thermosetting polymer layer (B) preferably exhibits a 180° peeling force of 2 gf to 50 gf after heat curing, the 180° peeling force being measured with a polyimide test piece having a width of 25 mm.

The thermosetting polymer layer (B) exhibiting such a peeling force prevents the wafer from slipping at the time of grinding the wafer, and facilitates separation. Thus, it is preferable.

Furthermore, the present invention provides a method for producing a thin wafer, comprising the steps of:

(a) grinding or polishing the back surface of the wafer temporarily bonded to the support via the temporary adhesive material for a wafer processing by the inventive temporary adhesion method;

(b) processing the back surface of the wafer; and (c) separating the processed wafer from the temporary adhesive material for a wafer processing and the support.

Such a method for producing a thin wafer, which uses the inventive two-layered temporary adhesive material layer to bond the wafer and the support, can easily manufacture a thin wafer having a through electrode structure or a bump interconnect structure.

The method preferably further comprises (d) cleaning a separation plane of the processed wafer after the step (c).

Such a method for producing a thin wafer can yield a wafer from which the thermoplastic resin layer (A) is completely removed even if the thermoplastic resin layer (A) remains on the front surface of the wafer after the separating step (c).

The step (c) preferably includes immersing the whole of the processed wafer in a solvent before the separating.

When the whole of the wafer is immersed in a solvent, the temporary adhesive material at the periphery of the wafer is swollen and decomposed. Thus, the wafer can be easily separated from the temporary adhesive material for a wafer processing and the support.

The step (d) preferably includes cleaning by two-fluid cleaning.

Two-fluid cleaning allows cleaning under high pressure. Thus, cleaning by two-fluid cleaning enables a residual resin to be removed in a short time.

Advantageous Effects of Invention

The complex temporary adhesive material layer in the present invention has the two-layered structure, and particularly uses the thermosetting polymer layer (B) as a supporting layer for bonding a substrate. This resin does not thermally decompose, does not flow especially at a high temperature of 200° C. or higher, and has excellent heat resistance. The temporary adhesive material layer is thus applicable to a wide range of semiconductor film-forming process. After the thin wafer is produced, the wafer can be easily separated from the support, for example, at room temperature. Thus, the thin wafer, which is easy to break, can be easily produced without breakage.

In addition, the method includes laminating the film resin (B') to form the thermosetting polymer layer (B) on the thermoplastic resin layer (A) or the support and then heating them under reduced pressure for attaching. This procedure prevents voids from occurring at the bonding interface on wafer side, etc., due to unevenness of the wafer. Moreover, this procedure to form the thermosetting polymer layer (B) and perform attaching allows the temporary adhesive material layer to be formed with high film-thickness uniformity even on a stepped wafer. This film-thickness uniformity enables easy production of a uniform thin wafer 50 μm or less thick. Furthermore, forming the thermosetting polymer layer (B) by this procedure reduces loss (cost) of the resin due to spin coating, improves flatness of the film thickness, eliminates a wafer cleaning solution for backside rinse, etc., and thus reduces the amount of waste liquid. When a thermosetting siloxane-modified polymer layer is used as the thermosetting polymer layer (B), a temporary adhesive material layer more excellent in CVD resistance can be formed.

BRIEF DESCRIPTION OF DRAWINGS

FIG. 1 is a cross-sectional view of an exemplary wafer processing laminate obtained by the attaching step in the inventive temporary adhesion method.

DESCRIPTION OF EMBODIMENTS

Hereinafter, the present invention will be described in detail.

As described above, there are demands for a temporary adhesion method and a method for producing a thin wafer that facilitate temporary adhesion, allow formation of the layer with uniform film thickness on a heavily stepped substrate, are highly compatible with the steps of forming a TSV and forming a wiring on the back surface of the wafer, have excellent resistance to a wafer thermal process such as CVD, allow easy separation, and can increase productivity of thin wafers.

The present inventors earnestly studied to accomplish the above object. Consequently, the inventors found that the object can be accomplished by a temporary adhesion method for temporarily bonding a support and a wafer having a front surface on which a circuit is formed and a back surface to be processed via a temporary adhesive material for a wafer processing, the method comprising the steps of:

attaching the wafer to the support via the temporary adhesive material for a wafer processing including a two-layered complex temporary adhesive material layer that consists of a first temporary adhesive layer composed of a thermoplastic resin layer (A) exhibiting a storage modulus E' of 1 to 500 MPa and a tensile rupture strength of 5 to 50 MPa at 25° C. and a second temporary adhesive layer composed of a thermosetting polymer layer (B) exhibiting a storage modulus E' of 1 to 1000 MPa and a tensile rupture strength of 1 to 50 MPa at 25° C. after curing, wherein the attaching is performed by forming the thermoplastic resin layer (A) on the front surface of the wafer from a liquid composition (A') containing a thermoplastic resin, forming the thermosetting polymer layer (B) on the support by laminating a film resin (B') that has been formed from a composition containing a thermosetting polymer, and then heating the wafer and the support under reduced pressure, or forming the thermoplastic resin layer (A) on the front surface of the wafer from the liquid composition (A'), forming the thermosetting polymer layer (B) on the resin layer (A) by laminating the film resin (B'), and then heating the wafer and the support under reduced pressure; and adhesively bonding the thermoplastic resin layer (A) and the thermosetting polymer layer (B) by heat curing the thermosetting polymer layer (B), thereby bringing the present invention to completion.

Hereinafter, a laminated material obtained by the attaching step in the inventive temporary adhesion method is also referred to as a wafer processing laminate. FIG. 1 is a cross-sectional view of an exemplary wafer processing laminate obtained by the attaching step in the inventive temporary adhesion method. As shown in FIG. 1, the wafer processing laminate has a wafer (device wafer) 1 having a front surface on which a circuit is formed and a back surface to be processed, a support 3 for supporting the wafer 1 during processing the wafer 1, and a complex temporary adhesive material layer 2 placed between the wafer 1 and the support 3. The complex temporary adhesive material layer 2 has a two-layered structure consisting of a thermoplastic resin layer (A) (first temporary adhesive layer) and a thermosetting polymer layer (B) (second temporary adhesive layer). The first temporary adhesive layer releasably adheres to the front surface of the wafer 1, and the second temporary adhesive layer releasably adheres to the support 3.

The temporary adhesive material for a wafer processing used in the inventive temporary adhesion method is composed of a laminated material of the layers (A) and (B).

The first temporary adhesive layer in the temporary adhesive material for a wafer processing exhibits a storage modulus E' of 1 to 500 MPa and a tensile rupture strength of 5 to 50 MPa at 25° C. When the storage modulus E' is less than 1 MPa, separation ability of the thermoplastic resin layer (A) decreases. When the storage modulus E' is more than 500 MPa, back surface grinding resistance of the wafer in the laminated material deteriorates, and CVD resistance cannot be achieved. Additionally, cracks can occur on the surface of the thermoplastic resin layer (A). When the tensile rupture strength is less than 5 MPa, separation ability decreases. When the tensile rupture strength is more than 50 MPa, many defects occur due to high rigidity, and adhesion property cannot be achieved.

The second temporary adhesive layer in the temporary adhesive material for a wafer processing exhibits a storage modulus E' of 1 to 1000 MPa and a tensile rupture strength of 1 to 50 MPa at 25° C. after curing. When the storage modulus E' after curing is less than 1 MPa, the wafer is likely to be separated during grinding the back surface of the wafer. When the storage modulus E' after curing is more than 1000 MPa, voids can occur at the bonding interface on wafer side, etc., due to unevenness of the wafer. When the tensile rupture strength after curing is less than 1 MPa, the wafer is likely to be separated during grinding the back surface of the wafer. When the tensile rupture strength after curing is more than 50 MPa, voids can occur at the bonding interface on wafer side, etc., due to unevenness of the wafer.

The storage modulus E' of the first temporary adhesive layer is preferably 5 to 300 MPa, more preferably 5 to 100 MPa, much more preferably 10 to 80 MPa. The tensile rupture strength of the first temporary adhesive layer is preferably 10 to 50 MPa. The storage modulus E' of the cured second temporary adhesive layer is preferably 5 to 800 MPa, more preferably 10 to 800 MPa, much more preferably 10 to 600 MPa. The tensile rupture strength of the cured second temporary adhesive layer is preferably to 40 MPa. Use of such a temporary adhesive material for a wafer processing more greatly prevents separation and cracking of the wafer during grinding the back surface of the wafer, enabling the wafer to be processed more stably.

A method of measuring the storage modulus E' and tensile rupture strength in the present invention will be now described. In the present invention, the storage modulus E' and tensile rupture strength are measured on respective films of the thermoplastic resin layer (A) and the thermosetting polymer layer (B).

Hereinafter, the present invention will be described in more detail, but the present invention is not limited thereto.

[Complex Temporary Adhesive Material Layer]

First, each layer constituting the complex temporary adhesive material layer (the temporary adhesive material for a wafer processing) used in the inventive adhesion method will be described.

—First Temporary Adhesive Layer (A)/Thermoplastic Resin Layer—

The thermoplastic resin layer (A) is a layer containing a thermoplastic resin. The thermoplastic resin layer (A) is preferably a non-silicon thermoplastic resin layer that contains an organopolysiloxane-free thermoplastic resin (a thermoplastic organopolysiloxane-free polymer layer). In view of applicability to stepped silicon wafers, etc., a non-silicone thermoplastic resin having a good spin coating property is suitably used as a material for forming the thermoplastic resin layer. In particular, the non-silicone thermoplastic resin preferably has a glass transition temperature of about −80 to 120° C. Examples thereof include an olefin type thermoplastic elastomer, a polybutadiene type thermoplastic elastomer, a styrene type thermoplastic elastomer, a styrene-butadiene type thermoplastic elastomer, and a styrene-polyolefin type thermoplastic elastomer. A hydrogenated polystyrene type elastomer excellent in heat resistance is particularly suitable. More specifically, there may be mentioned Tuftec (Asahi Kasei Chemicals Corporation), ESPOLEX SB series (Sumitomo Chemical Co., Ltd.), RABALON (Mitsubishi Chemical Corporation), SEPTON (Kuraray Co., Ltd.), and DYNARON (JSR Corporation). In addition, there may be mentioned a cycloolefin polymer represented by ZEONEX (ZEON Corporation) and a cyclic olefin copolymer represented by TOPAS (Nippon Polyplastics Co., Ltd.).

As descried above, the non-silicone thermoplastic resin is preferably a non-silicone thermoplastic elastomer. The complex temporary adhesive material layer including such a non-silicone thermoplastic elastomer enables, after a thin wafer is produced, the wafer to be easily separated from the support. Thus, a fragile thin wafer can be easily handled.

To the thermoplastic resin may be added an antioxidant for improving heat resistance, a surfactant for improving coating property, or a release agent for improving separation ability. Examples of the antioxidant that can be suitably used include di-tert-butylphenol. Examples of the surfactant that can be suitably used include a fluorinated silicone surfactant X-70-1102 (available from Shin-Etsu Chemical Co., Ltd.). Examples of the release agent that can be suitably used include KF-96 (available from Shin-Etsu Chemical Co., Ltd.).

—Second Temporary Adhesive Layer (B)/Thermosetting Polymer Layer—

The thermosetting polymer layer (B) is a layer containing a thermosetting polymer. The thermosetting polymer layer (B) is preferably a thermosetting siloxane-modified polymer layer. More specifically, a layer of a siloxane-containing composition mainly consisting of a thermosetting siloxane-modified polymer shown by the following general formula (1) or (3) is preferable.

Polymer of Formula (1) (Phenolic Siloxane Polymer):

A polymer of the general formula (1) is a siloxane bond-containing polymer. This polymer has a repeating unit shown by the general formula (1) and a weight average molecular weight of 3,000 to 500,000, preferably 10,000 to 100,000,

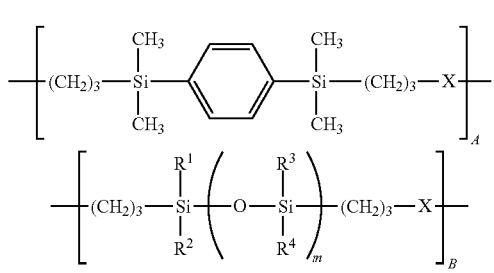

(1)

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and X is a divalent organic group shown by the following general formula (2),

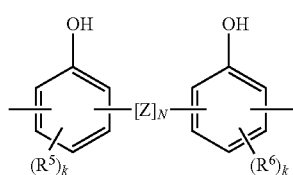

(2)

wherein Z represents a divalent organic group selected from any of

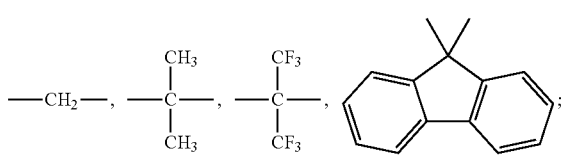

N represents 0 or 1; $R^5$ and $R^6$ each represent an alkyl or alkoxy group having 1 to 4 carbon atoms, and may be the same or different from each other; and "k" represents any of 0, 1, and 2.

In this case, illustrative examples of $R^1$ to $R^4$ include a methyl group, an ethyl group, and a phenyl group. "m" preferably represents an integer of 3 to 60, more preferably 8 to 40. B/A ranges from 0 to 20, particularly from 0.5 to 5. A is preferably 0 to 0.9; B is preferably 0.1 to 1. When A is larger than 0, A is preferably 0.1 to 0.7 and B is preferably 0.3 to 0.9.

Polymer of Formula (3) (Epoxy-Modified Siloxane Polymer):

A polymer of the general formula (3) is a siloxane bond-containing polymer. This polymer has a repeating unit shown by the general formula (3) and a weight average molecular weight of 3,000 to 500,000,

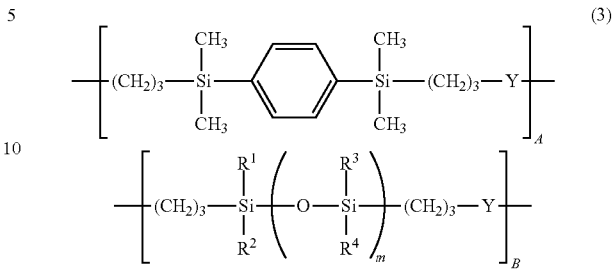

(3)

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and Y is a divalent organic group shown by the following general formula (4),

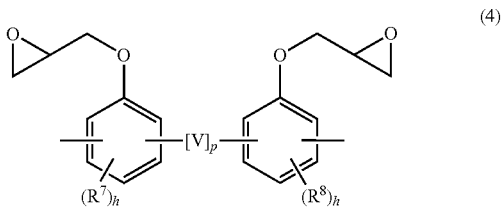

(4)

wherein V represents a divalent organic group selected from any of

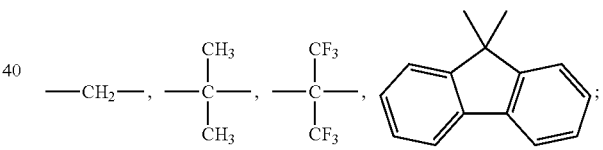

"p" represents 0 or 1; $R^7$ and $R^8$ each represent an alkyl or alkoxy group having 1 to 4 carbon atoms, and may be the same or different from each other; and "h" represents any of 0, 1, and 2.

In this case, illustrative examples of $R^1$ to $R^4$, "m" A, and 3 are the same as in the general formula (1).

The thermosetting siloxane-containing composition mainly consisting of the thermosetting siloxane-modified polymer of the general formula (1) or (3) contains one or more crosslinkers for heat curing. In the case of the phenolic siloxane polymer of the general formula (1), the crosslinker is selected from an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule.

Here, the amino condensate, the melamine resin, the urea resin each modified with formalin or formalin-alcohol may be exemplified by the following. For example, the melamine resin (condensate) modified with formalin or formalin-alcohol can be obtained by addition condensation polymerization of a modified melamine monomer (e.g. trimethoxymethyl monomethylol melamine), or a polymer thereof (e.g. oligomer such as dimer and trimer) with formaldehyde until a desired molecular weight is achieved, according to a known method. These compounds may be used alone or in combination of two or more kinds.

The urea resin (condensate) modified with formalin or formalin-alcohol can be prepared by modifying a urea condensate having a desired molecular weight with formalin into a methylol form, and optionally, further modifying the resultant compound with an alcohol into an alkoxy form, according to a known method. Illustrative examples of the urea resin modified with formalin or formalin-alcohol include methoxymethylated urea condensate, ethoxymethylated urea condensate, and propoxymethylated urea condensate. These compounds may be used alone or in combination of two or more kinds.

Illustrative examples of the phenol compound having on average two or more methylol or alkoxymethylol groups per molecule include (2-hydroxy-5-methyl)-1,3-benzenedimethanol and 2,2',6,6'-tetramethoxymethyl-bisphenol A. These phenol compounds may be used alone or in combination of two or more kinds.

On the other hand, in the case of the epoxy-modified siloxane polymer of the general formula (3), the composition contains one or more crosslinkers selected from an epoxy compound having on average two or more epoxy groups per molecule and a phenol compound having on average two or more phenol groups per molecule.

The epoxy compound having a polyfunctional epoxy group used in the polymers of the general formulae (1) and (3) is not particularly limited. In particular, a bi-functional, a tri-functional, a tetra-functional or more polyfunctional epoxy resins, for example, EOCN-1020, EOCN-102S, XD-1000, NC-2000-L, EPPN-201, GAN, and NC6000, all available from Nippon Kayaku Co., Ltd., or a crosslinker shown by the following formula may be contained.

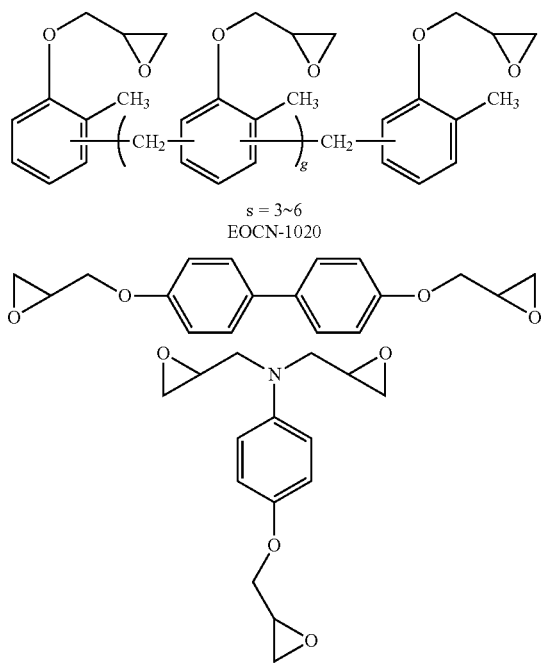

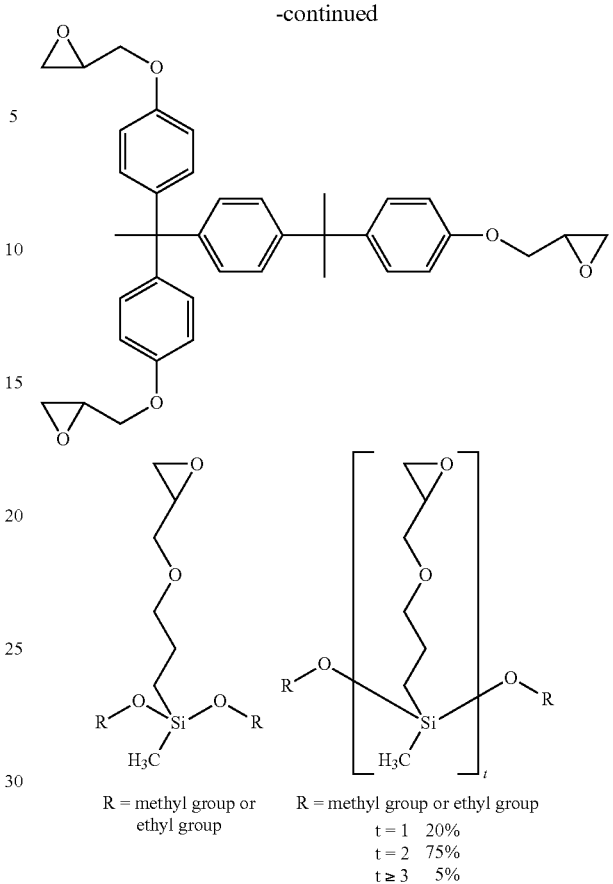

R = methyl group or ethyl group

R = methyl group or ethyl group
t = 1  20%
t = 2  75%
t ≥ 3  5%

In the case that the thermosetting siloxane-modified polymer is the epoxy-modified siloxane polymer of the general formula (3), examples of its crosslinker include m- or p-cresol-novolac resins such as EP-6030G available from Asahi Organic Chemicals Industry Co., Ltd., tri-functional phenol compounds such as Tris-P-PA available from Honshu Chemical Industry Co., Ltd., and tetra-functional phenol compounds such as TEP-TPA available from Asahi Organic Chemicals Industry Co., Ltd.

The formulation amount of the crosslinker is 0.1 to 50 parts by mass, preferably 0.1 to 30 parts by mass, more preferably 1 to 20 parts by mass based on 100 parts by mass of the thermosetting siloxane-modified polymer. Two, three or more crosslinkers may be blended in combination.

A curing catalyst such as an acid anhydride may be added in an amount of 10 parts by mass or less based on 100 parts by mass of the thermosetting siloxane-modified polymer.

A known antioxidant and a filler such as silica may be added in an amount of 50 parts by mass or less based on 100 parts by mass of the thermosetting siloxane-modified polymer to improve heat resistance. Moreover, a surfactant may be added to improve coating uniformity.

Illustrative examples of the antioxidant that can be added into the siloxane-containing composition include hindered phenol compounds such as tetrakis[methylene-(3,5-di-tert-butyl-4-hydroxyhydrocinnamate)]methane (product name: Adekastab AO-60).

The thermosetting polymer layer (B) typically exhibits a 180° peeling force of 2 gf to 50 gf, preferably 3 gf to 30 gf, more preferably 5 gf to 20 gf after heat curing when the 180° peeling force is measured with a polyimide test piece having a width of 25 mm. When the peeling force is 2 gf or more, the wafer is prevented from slipping at the time of grinding the wafer. When the peeling force is 50 gf or less, the wafer can be easily separated. In the case that the temporary adhesive material for a wafer processing and the support are separated after the wafer processing laminate is immersed in a solvent, a peeling force of 70 gf or less enables the temporary adhesive material for a wafer processing and the support to be easily separated.

[Temporary Adhesion Method]

Each step of the inventive temporary adhesion method using the above temporary adhesive material for a wafer processing will be now described.

[Attaching Step]

In this step, the wafer is attached to the support via the temporary adhesive material for a wafer processing by heating them under reduced pressure. More specifically, attaching is performed by either procedure: forming the thermoplastic resin layer (A) on the front surface of the wafer from a liquid composition (A'), forming the thermosetting polymer layer (B) on the support by laminating a film resin (B'), and then attaching the wafer to the support; or forming the thermoplastic resin layer (A) on the front surface of the wafer from the liquid composition (A'), forming the thermosetting polymer layer (B) on the resin layer (A) by laminating the film resin (B'), and then attaching the wafer to the support. Herein, the liquid composition (A') is a liquid composition containing a thermoplastic resin. The film resin (B') is a film formed from the composition containing a thermosetting polymer.

The wafer used in this step has a circuit-forming surface on one surface and a non-circuit-forming surface on the other surface. The wafer to which the present invention can be applied is typically a semiconductor wafer. Examples of the semiconductor wafer include not only a silicon wafer, but also a germanium wafer, a gallium-arsenic wafer, a gallium-phosphorus wafer, and a gallium-arsenic-aluminum wafer. The thickness of the wafer is typically, but not particularly limited to, 600 to 800 µm, more typically 625 to 775 µm.

As the support, a substrate such as a silicon wafer, a glass plate, and a quartz wafer can be used without any limitation. In the present invention, it is not necessary to irradiate the temporary adhesive material layer with an energy beam through the support, so that the support does not require light transmittance.

The thermoplastic resin layer (A) is formed on the front surface of, for example, a semiconductor substrate such as a silicon wafer from the liquid composition (A'). As described above, the liquid composition (A') contains a thermoplastic resin. For example, the liquid composition can be obtained by dissolving a thermoplastic resin in a solvent. In this case, the thermoplastic resin layer (A) can be formed on the front surface of the wafer by applying the liquid composition (A') onto the front surface of the wafer by, for example, spin coating, spray coating, or roll coating, followed by pre-baking. Alternatively, the thermoplastic resin layer (A) can be formed on the front surface of the wafer by forming a film of the liquid composition (A'), laminating this film on the front surface of the wafer, and pre-baking the film.

Preferable examples of the solvent include hydrocarbon solvents such as nonane, p-menthane, pinene, isooctane, toluene, xylene, and mesitylene. Among them, nonane, p-menthane, isooctane, and mesitylene are more preferable because of their coating properties.

Although the thickness of the film to be formed is not limited, the resin film is desirably formed according to unevenness of the substrate. The thermoplastic resin layer (A) is preferably formed on the front surface of the wafer with a thickness of 0.5 to 50 µm, more preferably 0.5 to 10 µm.

The thermosetting polymer layer (B) is formed on the support or the thermoplastic resin layer (A) formed on the front surface of the wafer by laminating the film resin (B'). This reduces loss (cost) of the resin due to spin coating, improves flatness of the film thickness, eliminates a wafer cleaning solution for backside rinse, etc., and thus reduces the amount of waste liquid.

The film resin (B') is obtained by forming the composition containing a thermosetting polymer into a film. When the composition containing a thermosetting polymer is formed into a film, an organic solvent for dissolving the composition containing a thermosetting polymer may be optionally used. In other words, the composition containing a thermosetting polymer may be used without solvent, or may be used after dissolving or dispersing in an organic solvent to prepare a solution or dispersion (a composition solution), as described below.

Examples of the organic solvent include N,N-dimethyl acetamide, methyl ethyl ketone, N,N-dimethyl formamide, cyclohexanone, cyclopentanone, N-methyl-2-pyrrolidone, toluene, methanol, ethanol, isopropanol, acetone, propylene glycol monomethyl ether, and propylene glycol monomethyl ether acetate. Preferable examples include methyl ethyl ketone, cyclopentanone, propylene glycol monomethyl ether, and propylene glycol monomethyl ether acetate. These organic solvents may be used alone or in combination of two or more kinds.

The thickness of the film resin (B') is preferably, but not particularly limited to, 10 µm to 200 µm, more preferably 20 µm to 120 µm. When the thickness is 10 µm or more, it can sufficiently withstand a grinding step for thinning the wafer. When the film thickness is 200 µm or less, the film resin is prevented from deforming in a heat treatment process such as TSV formation process, and can be put to practical use. Thus, this range is preferable.

Protective layers may be laminated on the film resin (B'). The protective layers that can be used will be described below. A film having the film resin (B') and the protective layers (a protective layer-attached resin film) can be produced by the following procedure.

[Method for Producing Protective Layer-Attached Resin Film]

The thermosetting polymer, the crosslinker, and if necessary, optional components and an organic solvent are previously mixed to prepare a solution of resin composition. This resin composition solution is applied to a protective layer (a protective film or a release film) by a die coater, a reverse roll coater, a comma center, or the like. The protective layer to which the resin composition solution is applied is made to pass through an inline dryer, and the organic solvent is removed to dry the layer at 80 to 160° C. over 2 to 20 minutes. The layer is then pressure-bonded and laminated to another protective layer by a roll laminator. The protective layer-attached resin film can be thus obtained. The pressure bonding condition for laminating is not particularly limited. Preferable condition is as follows: temperature, 50 to 100° C.; linear pressure, 0.5 to 5 kgf/cm; speed, 0.1 to 5 m/min.

In another aspect, a complex film formed of multiple resin films is obtained by the following procedure. Two or more identical or different protective layer-attached resin films are prepared. The protective layers are removed from the respective resin films such that the film resins (B') to be laminated are uncovered. The film resins (B') of the resin films are then laminated to form a complex film. In laminating, the films are preferably laminated while heating at 30 to 120° C. If two or more different film resins (B') are laminated, protective layers (protective films/release films) having different peeling force may be used as needed.

Protective Layer (Protective Film/Release Film)

The protective layers, which are used as a protective film and a release film for a wafer, are not particularly limited as long as the layers can be separated without deforming the film resin (B'). Examples thereof include plastic films such as a polyethylene (PE) film, a polypropylene (PP) film, a polymethylpentene (TPX) film, and a polyester film subjected to releasing treatment. The peeling force is preferably 50 to 300 mN/min. The thickness is 25 to 100 µm, preferably 38 to 75 µm.

The method of laminating the wafer with the film resin (B') is not particularly limited. For example, one of protective layers is removed from the protective layer-attached resin film. The protective layer-attached resin film on which the other protective layer remains is pressure-bonded to the support or the wafer having the thermoplastic resin layer (A) at once by a roll laminator, for example, a vacuum laminator TEAM-100RF, manufactured by Takatori Corporation in a vacuum chamber with a vacuum of 50 to 1,000 Pa, preferably 50 to 500 Pa, for example 250 Pa, at 80 to 200° C., preferably 80 to 130° C., for example 100° C. After the pressure is restored to normal pressure, the wafer is cooled to room temperature and taken out from the vacuum laminator. The other protective layer is then removed.

When the thermoplastic resin layer (A) and the thermosetting polymer layer (B) are formed, prebaking is preferably performed at 80 to 200° C., more preferably 100 to 180° C. depending on the volatile conditions of the solvent, although the temperature condition is not particularly limited thereto. For example, when the thermosetting polymer layer (B) is formed, the laminated film resin (B') laminated by the above method may be dried by heating at 100 to 180° C. for 1 to 5 minutes to form the thermosetting polymer layer (B).

The wafer and the support on which the layers (A) and (B) have been formed are joined via the layers (A) and (B) to form a substrate. The substrate is uniformly compressed under reduced pressure preferably at 40 to 200° C., more preferably 60 to 180° C. to form a wafer processing laminate (laminated substrate) in which the wafer and the support are joined. The reduced pressure condition is a reduced pressure atmosphere, preferably 0.01 to 500 Pa, more preferably 0.01 to 100 Pa. The compression condition is preferably 0.1 to 50 kN.

An apparatus for attaching the wafer may be a commercially available wafer-bonding apparatus, such as EVG520IS and 850 TB manufactured by EV Group.

[Bonding Step]

In this step, the thermoplastic resin layer (A) and the thermosetting polymer layer (B) are adhesively bonded by heat curing the thermosetting polymer layer (B). After the wafer processing laminate (laminated substrate) is formed, the wafer processing laminate is heated at 120 to 220° C., preferably 150 to 200° C., for 10 minutes to 4 hours, preferably 30 minutes to 2 hours to cure the thermosetting polymer layer (B).

[Method for Producing Thin Wafer]

Next, the inventive method for producing a thin wafer will be described. The inventive method for producing a thin wafer includes the steps (a) to (c) and optional steps (d) to (g). The thickness of a thin wafer obtained by the inventive producing method is typically 5 to 300 µm, more typically 10 to 100 µm.

[Step (a)]

The step (a) is a step of grinding or polishing the back surface of the wafer temporarily bonded to the support via the temporary adhesive material for a wafer processing by the inventive temporary adhesion method, i.e., a step of grinding or polishing the wafer processing laminate, which has been subjected to the bonding step in the inventive temporary adhesion method, from the wafer back surface side to reduce the thickness of the wafer. The technique for grinding the wafer back surface is not particularly limited, and known grinding techniques may be used. The grinding is preferably performed while water is fed to the wafer and a grinding wheel (e.g. diamond) for cooling. Examples of an apparatus for grinding the wafer back surface include DAG-810 (product name) manufactured by DISCO Co., Ltd. The wafer back surface side may be subjected to CMP polishing.

[Step (b)]

Step (b) is a step of processing the back surface of the wafer, i.e., a step of processing the non-circuit-forming surface of the wafer that has been thinned by grinding the back surface. This step includes various processes applied in the wafer level. Examples thereof include electrode formation, metal wiring formation, and protective film formation. More specifically, there may be mentioned well-known processes including metal sputtering for forming electrodes or the like, wet etching for etching a sputtered metal layer, patterning process in which a resist is applied and subjected to exposure and development to form a pattern used as a mask for metal wiring formation, resist removal, dry etching, plating with metal, silicon etching for forming a TSV, and formation of an oxide film on silicon surface.

[Step (c)]

Step (c) is a step of separating the wafer processed in the step (b) from the temporary adhesive material for a wafer processing and the support, i.e., a step of separating the thinned wafer, which has been subjected to various processes, from the temporary adhesive material for a wafer processing and the support before dicing. This separating step is generally carried out under relatively low temperature condition from room temperature to about 60° C. This step may be performed by a procedure in which one of the wafer and the support of the wafer processing laminate is horizontally fixed, and the other is lifted at a certain angle with respect to the horizontal direction; or a procedure in which a protective film is bonded to the ground surface of the wafer, and then the wafer and the protective film are separated from the wafer processing laminate by peeling.

Both the separating procedures can be applied to the present invention, although it is not limited to these procedures. These separating procedures are usually carried out at room temperature.

The step (c), separating the processed wafer from the temporary adhesive material for a wafer processing and the support, preferably includes the steps of:

(e) bonding a dicing tape to the processed surface (back surface) of the processed wafer;

(f) attaching the dicing tape surface by vacuum suction to a suction surface; and (g) separating the temporary adhesive material for a wafer processing and the support from the processed wafer by lift-off in a temperature range of the suction surface of 10° C. to 100° C. These steps enable the temporary adhesive material for a wafer processing and the support to be easily separated from the processed wafer, and facilitate a subsequent dicing step.

The step (c) preferably includes immersing the whole of the processed wafer in a solvent before the processed wafer is separated from the temporary adhesive material for a wafer processing and the support. This causes the temporary adhesive material at the periphery of the wafer to be swollen and decomposed. Thus, the wafer can be easily separated from the temporary adhesive material for a wafer processing and the support.

The solvent is any solvent that can swell and dissolve the thermoplastic resin layer (A) in the complex temporary adhesive material layer. Illustrative examples thereof include pentane, hexane, cyclohexane, decane, isononane, p-menthane, pinene, isododecane, limonene, toluene, xylene, and mesitylene. These solvents may be used alone or in combination of two or more kinds thereof.

Additionally, the method preferably includes (d) cleaning a separation plane of the processed wafer after the processed wafer is separated from the temporary adhesive material for a wafer processing and the support by the step (c). The circuit-forming surface of the wafer separated from the support by the step (c) can have residue of the thermoplastic resin layer (A) in some cases. This thermoplastic resin layer (A) can be removed by, for example, cleaning the wafer.

In the step (d), any cleaning solution capable of dissolving the thermoplastic resin layer (A) in the complex temporary adhesive material layer can be used. Illustrative examples thereof include pentane, hexane, cyclohexane, decane, isononane, p-menthane, pinene, isododecane, limonene, toluene, xylene, and mesitylene. These solvents may be used alone or in combination of two or more kinds thereof. If removal is difficult, a base or an acid may be added to the solvent. Examples of the usable base include amines such as ethanolamine, diethanolamine, triethanolamine, triethylamine, and ammonia; and ammonium salts such as tetramethylammonium hydroxide. Examples of the usable acid include organic acids such as acetic acid, oxalic acid, benzenesulfonic acid, and dodecylbenzenesulfonic acid. The amount thereof is 0.01 to 10 mass %, preferably 0.1 to 5 mass % in terms of concentration in the cleaning solution. To improve removal efficiency of residual matters, an existing surfactant may be added thereto.

The cleaning may be performed by a known method, such as paddling, spraying, or dipping in a cleaning tank with the above solution. Above all, the cleaning is preferably performed by two-fluid cleaning. Two-fluid cleaning allows cleaning under high pressure, thus enabling a residual resin to be removed in a short time. In this operation, nitrogen is preferably mixed. The cleaning time is preferably about 5 seconds to 10 minutes, more preferably 10 seconds to 5 minutes.

The cleaning temperature is preferably 10 to 80° C., more preferably 15 to 65° C. If necessary, the layer (A) may be dissolved in the dissolving solution, and the wafer may be finally rinsed with water or alcohol (preferably having 1 to 5 carbon atoms) and dried to obtain a thin wafer.

EXAMPLES

In the following, the present invention will be specifically described with reference to examples and comparative examples, but the present invention is not limited to these examples.

Resin Solution Production Example 1

16 g of a hydrogenated polystyrene-based thermoplastic resin, SEPTON8007 (available from Kuraray Co., Ltd.), was dissolved in 184 g of p-menthane to obtain a p-menthane solution containing 8 mass % SEPTON8007. The obtained solution was filtered through a 0.2-μm membrane filter to obtain a p-menthane solution of the non-silicone thermoplastic resin (A'-1).

Resin Solution Production Example 2

24 g of a hydrogenated polystyrene-based thermoplastic resin, SEPTON4033 (available from Kuraray Co., Ltd.), was dissolved in 176 g of p-menthane to obtain a p-menthane solution containing 12 mass % SEPTON4033. The obtained solution was filtered through a 0.2-μm membrane filter to obtain a p-menthane solution of the non-silicone thermoplastic resin (A'-2).

Resin Solution Production Example 3

10 g of a hydrogenated polystyrene-based thermoplastic resin, SEPTON4033 (available from Kuraray Co., Ltd.), and 10 g of a hydrogenated polystyrene-based thermoplastic resin, Tuftec H1043 (Asahi Kasei Chemicals Corporation), were dissolved in 180 g of p-menthane to obtain a p-menthane solution containing 10 mass % mixture of SEPTON4033 and Tuftec H1043. The obtained solution was filtered through a 0.2-μm membrane filter to obtain a p-menthane solution of the non-silicone thermoplastic resin (A'-3).

Resin Solution Production Example 4

10 g of a hydrogenated polystyrene-based thermoplastic resin, Tuftec H1043 (Asahi Kasei Chemicals Corporation), was dissolved in 190 g of p-menthane to obtain a p-menthane solution containing 5 mass % Tuftec H1043. The obtained solution was filtered through a 0.2-μm membrane filter to obtain a p-menthane solution of the non-silicone thermoplastic resin (A'-4).

Resin Synthesis Example 1

In a flask equipped with a stirrer, a thermometer, a nitrogen purge system, and a reflux condenser were put 43.1 g of 9,9'-bis(3-allyl-4-hydroxyphenyl)fluorene (M-1), 90.8 g of organohydrogensiloxane shown by the average structural formula (M-3), 135 g of toluene, and 0.04 g of chloroplatinic acid, and the mixture was heated at 80° C. Then, 13.6 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 80 g of cyclohexanone was added thereto to obtain a resin solution containing cyclohexanone as a solvent with a concentration of the resin solid of 50 mass %. When the molecular weight of the resin in the solution was measured by GPC, the weight average molecular weight was 50,000 in terms of polystyrene. Then, 50 g of the resin solution was mixed with 7.5 g of an epoxy crosslinker, EOCN-1020 available from NIPPON KAYAKU Co., Ltd., as a crosslinker, 0.2 g of BSDM (bis(tert-butylsulfonyl)diazomethane) available from Wako Pure Chemical Industries Ltd., as a curing catalyst, and 0.1 g of tetrakis[methylene-(3,5-di-tert-butyl-4-hydroxyhydrocinnamate)]methane (product name: Adekastab AO-60) as an antioxidant. The solution was then filtered through a 1-μm membrane filter to obtain a siloxane-containing composition solution (B"-1).

Resin Synthesis Example 2

In a 5-L flask equipped with a stirrer, a thermometer, a nitrogen purge system, and a reflux condenser, 84.1 g of epoxy compound (M-2) was dissolved in 250 g of toluene. Then, 121.0 g of compound (M-3) and 21.5 g of compound (M-4) were added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 250 g of methyl isobutyl ketone (MIBK) was added thereto. This reaction solution was filtered under pressure through a filter to remove the platinum catalyst. The solvent in the resin solution was distilled off under reduced pressure, and 150 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight average molecular weight was 45,000 in terms of polystyrene. Then, 100 g of the resin solution was mixed with 9 g of a tetra-functional phenol compound, TEP-TPA (available from Asahi Organic Chemicals Industry Co., Ltd.), and 0.2 g of tetrahydrophthalic anhydride (RIKACID HH-A, available from New Japan Chemical Co., Ltd.). The solution was then filtered through a 1-μm membrane filter to obtain a siloxane-containing composition solution (B"-2).

Resin Synthesis Example 3

In a 5-L flask equipped with a stirrer, a thermometer, a nitrogen purge system, and a reflux condenser, 84.1 g of epoxy compound (M-2) was dissolved in 170 g of toluene. Then, 60.5 g of compound (M-3) and 24.2 g of compound (M-4) were added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 170 g of methyl isobutyl ketone (MIRK) was added thereto. This reaction solution was filtered under pressure through a filter to remove the platinum catalyst. The solvent in the resin solution was distilled off under reduced pressure, and 110 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight average molecular weight was 42,000 in terms of polystyrene. Then, 100 g of the resin solution was mixed with 9 g of a tetra-functional phenol compound, TEP-TPA (available from Asahi Organic Chemicals Industry Co., Ltd.), and 0.2 g of tetrahydrophthalic anhydride (RIKACID HH-A, available from New Japan Chemical Co., Ltd.). The solution was then filtered through a 1-μm membrane filter to obtain a siloxane-containing composition solution (B"-3).

Resin Synthesis Example 4

In a 5-L flask equipped with a stirrer, a thermometer, a nitrogen purge system, and a reflux condenser, 84.1 g of epoxy compound (M-2) was dissolved in 150 g of toluene. Then, 30.3 g of compound (M-3) and 25.5 g of compound (M-4) were added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 150 g of methyl isobutyl ketone (MIBK) was added thereto. This reaction solution was filtered under pressure through a filter to remove the platinum catalyst. The solvent in the resin solution was distilled off under reduced pressure, and 90 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight average molecular weight was 35,000 in terms of polystyrene. Then, 100 g of the resin solution was mixed with 9 g of a tetra-functional phenol compound, TEP-TPA (available from Asahi Organic Chemicals Industry Co., Ltd.), and 0.2 g of tetrahydrophthalic anhydride (RIKACID HH-A, available from New Japan Chemical Co., Ltd.). The solution was then filtered through a 1-μm membrane filter to obtain a siloxane-containing composition solution (B"-4).

Resin Synthesis Example 5

In a 5-L flask equipped with a stirrer, a thermometer, a nitrogen purge system, and a reflux condenser, 84.1 g of epoxy compound (M-2) was dissolved in 120 g of toluene. Then, 9.1 g of compound (M-3) and 26.5 g of compound (M-4) were added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 120 g of methyl isobutyl ketone (MIBK) was added thereto. This reaction solution was filtered under pressure through a filter to remove the platinum catalyst. The solvent in the resin solution was distilled off under reduced pressure, and 75 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight average molecular weight was 28,000 in terms of polystyrene. Then, 100 g of the resin solution was mixed with 9 g of a tetra-functional phenol compound, TEP-TPA (available from Asahi Organic Chemicals Industry Co., Ltd.), and 0.2 g of tetrahydrophthalic anhydride (RIKACID HH-A, available from New Japan Chemical Co., Ltd.). The solution was then filtered through a 1-μm membrane filter to obtain a siloxane-containing composition solution (B"-5).

Comparative Resin Synthesis Example 1

In a 5-L flask equipped with a stirrer, a thermometer, a nitrogen purge system, and a reflux condenser, 84.1 g of epoxy compound (M-2) was dissolved in 110 g of toluene. Then, 26.9 g of compound (M-4) was added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 110 g of methyl isobutyl ketone (MIBK) was added thereto. This reaction solution was filtered under pressure through a filter to remove the platinum catalyst. The solvent in the resin solution was distilled off under reduced pressure, and 70 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight average molecular weight was 25,000 in terms of polystyrene. Then, 100 g of the resin solution was mixed with 9 g of a tetra-functional phenol compound, TEP-TPA (available from Asahi Organic Chemicals Industry Co., Ltd.), and 0.2 g of tetrahydrophthalic anhydride (RIKACID HH-A, available from New Japan Chemical Co., Ltd.). The solution was then filtered through a 1-μm membrane filter to obtain a siloxane-containing composition solution (B"-6).

Comparative Resin Synthesis Example 2

In a 5-L flask equipped with a stirrer, a thermometer, a nitrogen purge system, and a reflux condenser, 28.0 g of epoxy compound (M-2) was dissolved in 130 g of toluene. Then, 100.9 g of compound (M-3) and 4.5 g of compound (M-4) were added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 130 g of methyl isobutyl ketone (MIBK) was added thereto. This reaction solution was filtered under pressure through a filter to remove the platinum catalyst. The solvent in the resin solution was distilled off under reduced pressure, and 80 g of propylene glycol monomethyl ether acetate (PGMEA) was added thereto to obtain a resin solution containing PGMEA as a solvent with a concentration of the solid component of 60 mass %. When the molecular weight of the resin in the resin solution was measured by GPC, the weight average molecular weight was 52,000 in terms of polystyrene. Then, 100 g of the resin solution was mixed with 9 g of a tetra-functional phenol compound, TEP-TPA (available from Asahi Organic Chemicals Industry Co., Ltd.), and 0.2 g of tetrahydrophthalic anhydride (RIKACID HH-A, available from New Japan Chemical Co., Ltd.). The solution was then filtered through a 1-μm membrane filter to obtain a siloxane-containing composition solution (B"-7).

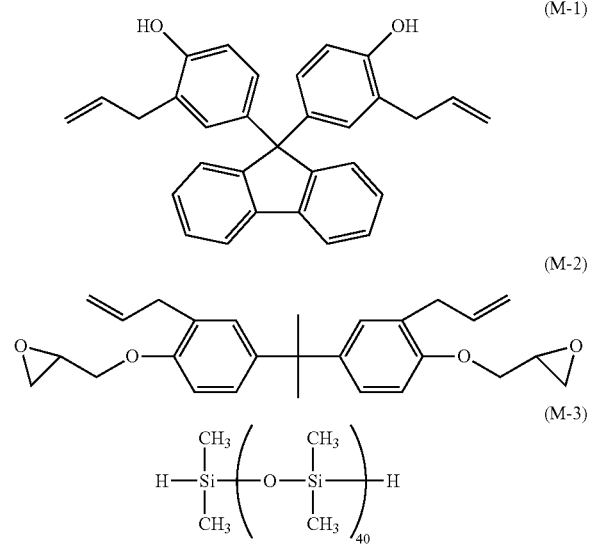

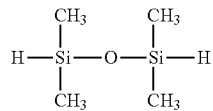

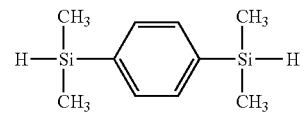

(Formation of Protective Layer-Attached Resin Film)

The resin composition solutions in Resin synthesis examples 1 to 5 and Comparative resin synthesis examples 1 and 2 were each applied to a release film (1), E7304 shown below, by using a die coater as film coater. The applied film was then made to pass through a hot-air circulating oven (length: 4 m) at 100° C. for 5 minutes to form a film resin having a thickness of 50 to 60 μm on the release film (1).

Then, a polyethylene film (thickness: 100 μm) was attached to each film resin by a laminate roll with a linear pressure of 10 N/cm to produce protective layer-attached resin films composed of the release film, the film resin (B'-1) to (B'-7), and the protective film.

(Release Film/Protective Film)

Release film: E7304 (made of polyester, thickness: 75 μm, peeling force: 200 mN/50 mm, available from Toyobc Co., Ltd.)

Protective film: polyethylene film (100 μm)

Examples 1, 2, 4-8 and Comparative Example 1-4

Onto a 200-mm diameter silicon wafer (thickness: 725 μm) whose entire surface was formed with copper posts having height of 10 μm and diameter of 40 μm, the solution containing the thermoplastic resin ((A'-1) to (A'-4)) was applied by spin coating, and then heated with a hot plate at 150° C. for 5 minutes to form a layer (A-1) to (A-4) corresponding to the layer (A), having a thickness shown in Table 1, on the bump-forming surface of the wafer. On the other hand, a 200-mm diameter glass plate (thickness: 500 μm) was prepared as the support. The protective film was removed from the protective layer-attached resin film, and the film resin ((B'-1) to (B'-7)) was laminated to the support at once by a vacuum laminator (TEAM-100RF, manufactured by Takatori Corporation) in a vacuum chamber with a vacuum of 250 Pa at 110° C. After the pressure was restored to normal pressure, the support was cooled to 25° C. and taken out from the vacuum laminator. The remaining release film was then removed. In Comparative example 4, the composition solution (B"-5) was applied on the support by spin coating instead of laminating the film resin.

The glass support was then heated with a hot plate at 150° C. for 5 minutes to form a layer (B-1) to (B-7) corresponding to the layer (B), having a thickness shown in Table 1, on the support. The wafer having the layer (A) and the grass plate having the layer (B) thus obtained were joined under the following reduced pressure condition at adhesion temperature shown in Table 1 such that their resin surfaces faced each other to produce a wafer processing laminate.

Example 3

In Example 3, the solution containing the thermoplastic resin (A'-2) was applied on the wafer by spin coating and then heated with a hot plate at 150° C. for 5 minutes to form a layer (A-2) corresponding the layer (A), having a thickness shown in Table 1 on the bump-forming surface of the wafer. The protective film was removed from the protective layer-attached resin film, and the film resin (B'-1) was attached to the wafer at once by a vacuum laminator (TEAM-100RF, manufactured by Takatori Corporation) in a vacuum chamber with a vacuum of 250 Pa at 110° C. After the pressure was restored to normal pressure, the support was cooled to 25° C. and taken out from the vacuum laminator. The remaining release film was then removed.

The wafer was then heated with a hot plate at 150° C. for 5 minutes to form a layer (B-1) corresponding to the layer (B) on the wafer having the layer (A). The wafer having the layers (A) and (B) thus obtained and the grass plate of the support were joined under reduced pressure at adhesion temperature shown in Table 1 to produce a wafer processing laminate.

In examples and comparative examples, the 200-mm diameter wafer was attached by a wafer-bonding apparatus EVG520IS manufactured by EV Group. The attaching was performed at adhesion temperature shown in Table 1, with a pressure inside the chamber of $10^{-3}$ mbar or less, and a load of 5 kN for 1 minute.

In the above examples, the glass plate was used as the support for the purpose of observing abnormalities after joining the substrate, but a silicon substrate such as a wafer, which does not transmit light, can be used instead.

Thereafter, the joined substrate was subjected to the following tests. The results of examples and comparative examples are shown in Table 1. In addition, evaluations were carried out in order described below. When the result became anomaly (the judgment is "poor") during the tests, the evaluation thereafter was stopped, and showed with "-" in Table 1.

The storage modulus E' and the tensile rupture strength were measured in accordance with JIS K 7244 and JIS K 7127, respectively.

—Adhesion Test—

After attaching, the substrate was heated with an oven at 180° C. for 1 hour to cure the layer (B). The substrate was then cooled to room temperature, and adhesion state of its interface was observed by naked eye and optical microscope. When no abnormality like bubbles was found at the interface, the specimen was evaluated as good, and shown with "good". When an abnormality was found, the specimen was evaluated as poor, and shown with "poor".

—Back Surface Grinding Resistance Test—

The back surface of the silicon wafer was ground by a grinder (DAG810, manufactured by DISCO Co., Ltd.) with a diamond grinding wheel. After the wafer was ground to a final substrate thickness of 50 µm, abnormalities such as crack and separation were checked with an optical microscope (100-folds). When no abnormality was found, the specimen was evaluated as good, and shown with "good". When an abnormality was found, the specimen was evaluated as poor, and shown with "poor".

—CVD Resistance Test—

After the back surface of the silicon wafer was ground, the processing laminate was put into a CVD apparatus and subjected to a test of forming a SiO$_2$ film 2 thick to check abnormalities in appearance at that time. When no appearance abnormality was found, the specimen was evaluated as good, and shown with "good". When appearance abnormality such as voids, swelling of the wafer, and breakage of the wafer was found, the specimen was evaluated as poor, and shown with "poor". The conditions of the CVD resistance test are as follows.

Apparatus: Plasma CVD PD270STL (manufactured by SAMCO Inc.)
RF: 500 W, internal pressure: 40 Pa
TEOS (tetraethyl orthosilicate): O$_2$=20 sccm:680 sccm —Separation Test—

Separation ability of the substrate was evaluated in the following manner. First, a dicing tape was bonded to the wafer side of the wafer processing laminate, which had been thinned to 50 µm and subjected to the CVD resistance test, with a dicing frame. This dicing tape surface was set to a suction plate by vacuum suction. Then, one point of the glass was lifted by tweezers at room temperature to separate the glass substrate. Additionally, separation ability was also measured on a substrate that was immersed in p-menthane at room temperature for 5 minutes before separating. When the support could be separated without cracking the 50-µm wafer, the specimen was shown with "good". When an abnormality such as cracks occurred, the specimen was evaluated as poor, and shown with "poor".

—Cleaning Removability Test—

After the separation ability test, the 200-mm wafer (which had been exposed to the CVD resistance test condition) mounted on the dicing frame via the dicing tape was set on a spin coater with the adhesive layer upside. The wafer was cleaned with a cleaning solution, namely mesitylene, by either procedure: spraying for 5 minutes or 1 minute; or two-fluid cleaning (mixing with nitrogen) for 1 minute. The wafer was then rinsed by spraying isopropyl alcohol (IPA) while rotating the wafer. The two-fluid cleaning was carried out with Delta12L manufactured by SUSS MicroTec AG. Thereafter, appearance of the wafer was observed by naked eye to check residue of the adhesive material resin. When no resin remained, the specimen was evaluated as good, and shown with "good". When the resin partially remained, the specimen was evaluated as partially defective, and shown with "fair". When the resin remained on the whole of the wafer, the specimen was evaluated as poor, and shown with "poor".

—Peeling Force Test—

Onto a 200-mm diameter silicon wafer (thickness: 725 µm), the solution containing the thermoplastic resin ((A'-1) to (A'-4)) was applied by spin coating, and then heated with a hot plate at 150° C. for 5 minutes to form a layer (A-1) to (A-4) corresponding to the layer (A), having a thickness shown in Table 1, on the bump-forming surface of the wafer. Then, the film resin ((B'-1) to (B'-7)) was laminated on the layer (A) formed on the silicon wafer and then heated with a hot plate at 150° C. for 3 minutes to form a layer (B-1) to (B-7) corresponding to the layer (B), having a thickness of 50 to 60 µm. The layer (B) was then cured by an oven at 180° C. over 1 hour. In Comparative example 4, the composition solution (B"-5) was applied on the layer (A) by spin coating instead of laminating the film resin.

Then, five polyimide tapes with a length of 150 mm and a width of 25 mm were attached to the layer (B) on the wafer, and a part of the temporary adhesive layer to which no tape has been attached was removed. 120 mm of the tapes were then peeled off from one end by 180° peeling at a speed of 300 mm/minute with AUTOGRAPH (AG-1) manufactured by Shimadzu Co. (120 mm stroke, 5 times), and an average force applied at this time was measured as a peeling force of the temporary adhesive layer (A/B).

TABLE 1

|  | Example 1 | Example 2 | Example 3 | Example 4 | Example 5 | Example 6 | Example 7 |
|---|---|---|---|---|---|---|---|
| Resin layer (A) | A-1 | A-2 | A-2 | A-2 | A-2 | A-2 | A-3 |
| Thickness of layer (A) | 5 μm | 5 μm | 5 μm | 5 μm | 5 μm | 5 μm | 5 μm |
| E' of layer (A) (MPa at 25° C.) | 150 | 25 | 25 | 25 | 25 | 25 | 280 |
| Tensile rupture strength of layer (A) (MPa at 25° C.) | 43 | 30 | 30 | 30 | 30 | 30 | 45 |
| Surface state of layer (A) *1 | good | good | good | good | good | good | good |
| Resin layer (B) | B-1 | B-1 | B-1 | B-2 | B-3 | B-4 | B-4 |
| Layer (B) formation method *2 | a | a | a | a | a | a | a |
| Formation position of layer (B) *3 | c | c | d | c | c | c | c |
| Thickness of layer (B) | 60 μm | 60 μm | 60 μm | 60 μm | 50 μm | 60 μm | 60 μm |
| Sx content in layer (B) (wt %) | 62 | 62 | 62 | 63 | 50 | 40 | 40 |
| Peeling force of layer (B) | 7 gf | 5 gf | 5 gf | 10 gf | 20 gf | 50 gf | 50 gf |
| E' of layer (B) (MPa at 25° C.) | 21 | 21 | 21 | 103 | 260 | 420 | 420 |
| Tensile rupture strength of layer (B) (MPa at 25° C.) | 8 | 8 | 8 | 7 | 12 | 18 | 18 |
| Adhesion temperature | 110° C. | 110° C. | 110° C. | 120° C. | 130° C. | 140° C. | 140° C. |
| Thickness uniformity of layer (B) | <1 μm | <1 μm | — | <1 μm | <1 μm | <1 μm | <1 μm |
| Adhesiveness  Naked eye | good | good | good | good | good | good | good |
| Optical microscope | good | good | good | good | good | good | good |
| Back surface grinding resistance | good | good | good | good | good | good | good |
| CVD resistance | good | good | good | good | good | good | good |
| Separation ability  without immersing in solvent | good | good | good | good | good | good | good |
| immersing in solvent (p-menthane 5 min) | good | good | good | good | good | good | good |
| Cleaning efficiency  Spray 5 min | good | good | good | good | good | good | good |
| Spray 1 min | fair | fair | fair | fair | fair | fair | fair |
| Two-fluid cleaning 1 min | good | good | good | good | good | good | good |

|  | Example 8 | Comparative Example 1 | Comparative Example 2 | Comparative Example 3 | Comparative Example 4 |
|---|---|---|---|---|---|
| Resin layer (A) | A-2 | A-4 | A-2 | A-2 | A-2 |
| Thickness of layer (A) | 5 μm | 5 μm | 5 μm | 5 μm | 5 μm |
| E' of layer (A) (MPa at 25° C.) | 25 | 760 | 25 | 25 | 25 |
| Tensile rupture strength of layer (A) (MPa at 25° C.) | 30 | 10 | 30 | 30 | 30 |
| Surface state of layer (A) *1 | good | poor | good | good | good |
| Resin layer (B) | B-5 | — | B-6 | B-7 | B-5 |
| Layer (B) formation method *2 | a | — | a | a | b |
| Formation position of layer (B) *3 | c | — | c | c | c |
| layer (B) | 60 μm | — | 60 μm | 60 μm | 60 μm |
| Sx content in layer (B) (wt %) | 30 | — | 24 | 79 | 30 |
| Peeling force of layer (B) | 80 gf | — | >100 gf | <1 gf | 90 gf |
| E' of layer (B) (MPa at 25° C.) | 630 | — | 1100 | 12 | 630 |
| Tensile rupture strength of layer (B) (MPa at 25° C.) | 31 | — | 55 | <1 | 31 |
| Adhesion temperature | 150° C. | — | 160° C. | 100° C. | 150° C. |
| Thickness uniformity of layer (B) | <1 μm | — | <3 μm | <1 μm | <10 μm |
| Adhesiveness  Naked eye | good | — | good | good | good |
| Optical microscope | good | — | poor | good | poor |
| Back surface grinding resistance | good | — | — | poor | — |
| CVD resistance | good | — | — | — | — |
| Separation ability  without immersing in solvent | good | — | — | — | — |
| immersing in solvent | good | — | — | — | — |

TABLE 1-continued

|  |  |  |  |  |  |  |  |
|---|---|---|---|---|---|---|---|
| Cleaning efficiency | (p-menthane 5 min) Spray 5 min | good | — | — | — | — |  |
|  | Spray 1 min | fair | — | — | — | — |  |
|  | Two-fluid cleaning 1 min | good | — | — | — | — |  |

*1 good: uniform surface, poor: crack occurrence
*2 a: film lamination, b: spin coating
*3 c: on supporting substrate, d: on layer (A)

In Table 1, Sx denotes the amount of siloxane with respect to the total weight.

Table 1 shows that Examples 1 to 8, which satisfy the requirements of the present invention, facilitated temporary adhesion and separation. By contrast, in Comparative example 1, whose layer (A) had a storage modulus E' of more than 500 MPa, cracks occurred on the film surface after applying the layer (A). In Comparative example 2, whose layer (B) had a storage modulus E' of more than 1000 MPa and a tensile rupture strength of more than 50 MPa, voids were found by observation with an optical microscope after attaching. In Comparative example 3, whose layer (B) had a tensile rupture strength of less than 1 MPa, separation was caused when the back surface was ground. In Comparative example 4, whose layer (B) was formed by spin coating, voids were found by observation with an optical microscope after attaching.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A temporary adhesion method for temporarily bonding a support and a wafer having a front surface on which a circuit is formed and a back surface to be processed via a temporary adhesive material for a wafer processing, the method comprising the steps of:
    attaching the wafer to the support via the temporary adhesive material for a wafer processing including a two-layered complex temporary adhesive material layer that consists of a first temporary adhesive layer composed of a thermoplastic resin layer (A) exhibiting a storage modulus E' of 1 to 500 MPa and a tensile rupture strength of 5 to 50 MPa at 25° C. and a second temporary adhesive layer composed of a thermosetting polymer layer (B) exhibiting a storage modulus E' of 1 to 1000 MPa and a tensile rupture strength of 1 to 50 MPa at 25° C. after curing,
    wherein the attaching is performed by removing a first protective layer from a protective layer-attached resin film, which has a film resin (B') that has been formed from a composition containing a thermosetting polymer and the protective layers formed on the front and back surfaces of the film resin (B'), forming the thermoplastic resin layer (A) on the front surface of the wafer from a liquid composition (A') containing a thermoplastic resin, forming the thermosetting polymer layer (B) on the support by laminating a film resin (B') on which a second protective layer remains, and removing the second protective layer, and then heating the wafer and the support under reduced pressure, or forming the thermoplastic resin layer (A) on the front surface of the wafer from the liquid composition (A'), forming the thermosetting polymer layer (B) on the resin layer (A) by laminating the film resin (B') on which the second protective layer remains, and removing the second protective layer, and then heating the wafer and the support under reduced pressure; and
    adhesively bonding the thermoplastic resin layer (A) and the thermosetting polymer layer (B) by heat curing the thermosetting polymer layer (B).

2. The temporary adhesion method according to claim 1, wherein, in the step of attaching, the attaching is performed under heating at 40 to 200° C.

3. The temporary adhesion method according to claim 2, wherein the thermoplastic resin layer (A) is a non-silicone thermoplastic resin layer.

4. The temporary adhesion method according to claim 1, wherein the thermoplastic resin layer (A) is a non-silicone thermoplastic resin layer.

5. The temporary adhesion method according to claim 1, wherein the thermosetting polymer layer (B) is a thermosetting siloxane-modified polymer layer.

6. The temporary adhesion method according to claim 5, wherein the thermosetting siloxane-modified polymer layer is a layer of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

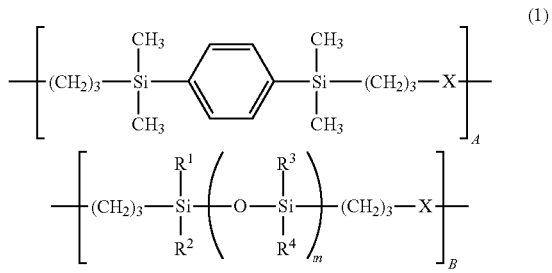

wherein $R^1$ to $R^4$ may be the same or different, and represent a monovalent hydrocarbon group having 1 to 8 carbon atoms; "m" is an integer of 1 to 100; B is a positive number;

A is 0 or a positive number, provided that A+B=1; and X is a divalent organic group shown by the following general formula (2),

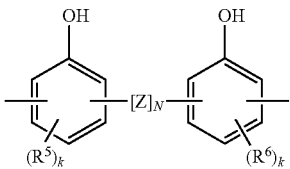

(2)

wherein Z represents a divalent organic group selected from any of

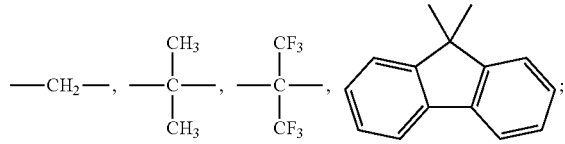

N represents 0 or 1; $R^5$ and $R^6$ each represent an alkyl or alkoxy group having 1 to 4 carbon atoms, and may be the same or different from each other; and "k" represents any of 0, 1, and 2.

7. The temporary adhesion method according to claim 5, wherein the thermosetting siloxane-modified polymer layer is a layer of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

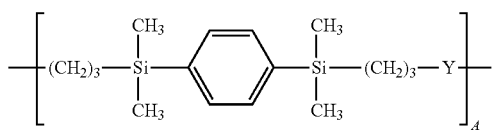

(3)

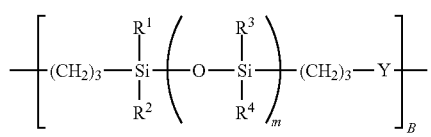

wherein $R^1$ to $R^4$ may be the same or different, and represent a monovalent hydrocarbon group having 1 to 8 carbon atoms; "m" is an integer of 1 to 100; B is a positive number; A is 0 or a positive number, provided that A+B=1; and Y is a divalent organic group shown by the following general formula (4),

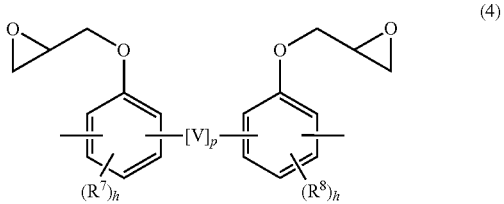

(4)

wherein V represents a divalent organic group selected from any of

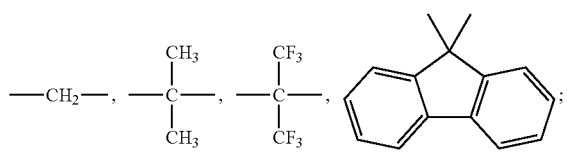

"p" represents 0 or 1; $R^7$ and $R^8$ each represent an alkyl or alkoxy group having 1 to 4 carbon atoms, and may be the same or different from each other; and "h" represents any of 0, 1, and 2.

8. The temporary adhesion method according to claim 1, wherein the thermosetting polymer layer (B) exhibits a 180° peeling force of 2 gf to 50 gf after heat curing, the 180° peeling force being measured with a polyimide test piece having a width of 25 mm.

9. A method for producing a thin wafer, comprising the steps of:
(a) grinding or polishing the back surface of the wafer temporarily bonded to the support via the temporary adhesive material for a wafer processing by the temporary adhesion method according to claim 1;
(b) processing the back surface of the wafer; and
(c) separating the processed wafer from the temporary adhesive material for a wafer processing and the support.

10. The method for producing a thin wafer according to claim 9, further comprising (d) cleaning a separation plane of the processed wafer after the step (c).

11. The method for producing a thin wafer according to claim 10, wherein the step (c) includes immersing the whole of the processed wafer in a solvent before the separating.

12. The method for producing a thin wafer according to claim 11, wherein the step (d) includes cleaning by two-fluid cleaning.

13. The method for producing a thin wafer according to claim 10, wherein the step (d) includes cleaning by two-fluid cleaning.

14. The method for producing a thin wafer according to claim 9, wherein the step (c) includes immersing the whole of the processed wafer in a solvent before the separating.

15. The method for producing a thin wafer according to claim 14, wherein the step (d) includes cleaning by two-fluid cleaning.

16. The temporary adhesion method according to claim 1, wherein the laminating the wafer with the film resin (B') on which the second protective layer remains is conducted by pressure-bonding the film resin (B') on which the second protective layer remains to the support or the wafer having the thermoplastic resin layer (A) at once, at 80 to 200° C.

17. The temporary adhesion method according to claim 1, wherein the temporary adhesive material for a wafer processing consists of two layers of the first temporary adhesive layer composed of a thermoplastic resin layer (A) and the second temporary adhesive layer composed of a thermosetting polymer layer (B).

18. The temporary adhesion method according to claim 1, wherein the thickness of the film resin (B') is 10 µm to 200 µm.

* * * * *